(12) United States Patent
Kitamura

(10) Patent No.: US 8,217,392 B2
(45) Date of Patent: Jul. 10, 2012

(54) ORGANIC ELECTROLUMINESCENCE ELEMENT

(75) Inventor: Yoshitaka Kitamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 214 days.

(21) Appl. No.: 12/795,240

(22) Filed: Jun. 7, 2010

(65) Prior Publication Data
US 2010/0314613 A1  Dec. 16, 2010

(30) Foreign Application Priority Data

Jun. 11, 2009  (JP) .................................. 2009-140370

(51) Int. Cl.
*H01L 51/54*  (2006.01)
(52) U.S. Cl. ........... 257/40; 257/E51.001; 257/E51.041; 313/504
(58) Field of Classification Search .................... 257/40, 257/E51.001, E51.041; 313/504
See application file for complete search history.

(56) References Cited

U.S. PATENT DOCUMENTS

| | | | |
|---|---|---|---|
| 2006/0202197 A1* | 9/2006 | Nakayama et al. ............. | 257/40 |
| 2008/0036373 A1* | 2/2008 | Itoh et al. ...................... | 313/504 |
| 2008/0054799 A1* | 3/2008 | Satou ............................. | 313/504 |
| 2009/0153045 A1* | 6/2009 | Kinoshita et al. ............. | 313/504 |

FOREIGN PATENT DOCUMENTS

JP  2006-121032 A  5/2006

* cited by examiner

*Primary Examiner* — Benjamin Sandvik
*Assistant Examiner* — Whitney T Moore
(74) *Attorney, Agent, or Firm* — Sughrue Mion, PLLC

(57) ABSTRACT

To provide an organic electroluminescence element, containing: at least one pair of electrodes; at least one organic light-emitting layer disposed between the electrodes, the organic light-emitting layer comprising two phosphorescent light-emitting materials and a charge-transporting material, wherein the organic light-emitting element is a white organic light-emitting element, and the charge-transporting material is a hole-transporting material, and wherein one of the two phosphorescent light-emitting materials is a platinum complex expressed by the following general formula 1, and the other is an iridium complex expressed by any one of the following general formulae 2A to 2C:

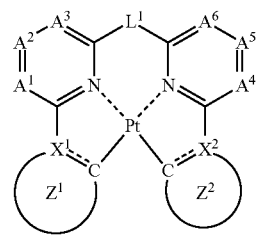

General formula 1

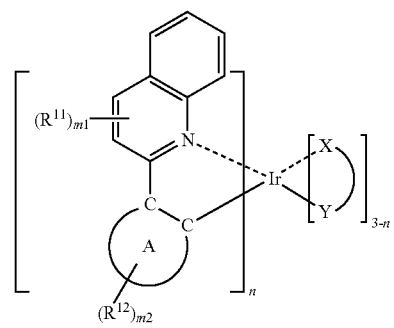

General formula 2A

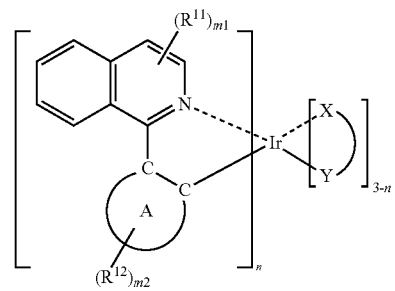

General formula 2B

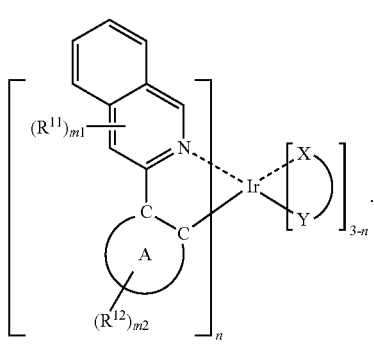

General formula 2C

18 Claims, No Drawings

ORGANIC ELECTROLUMINESCENCE ELEMENT

BACKGROUND OF THE INVENTION

1. Field of the Invention

The present invention relates to an organic electroluminescence element (may also referred to as an organic EL element, hereinafter).

2. Description of the Related Art

Organic electroluminescence elements using organic compounds have drawn the attentions of people in the art due to their great potential to be used as inexpensive, large, full-color solid luminescence display elements, or writing light arrays, and hence various studies and researches have been conducted on them. Generally, an organic electroluminescence element is composed of a couple of counter electrodes and a light-emitting layer disposed between the electrodes. Once an electric field is applied to both electrodes, electrons are injected from a cathode and holes are injected from an anode. These electrons and holes are recombined in a light-emitting layer, and when the electrons return from a conduction band to a valence band, energy is released from the electrons as light. In this manner, light is emitted from an organic electroluminescence element.

Conventional organic electroluminescence elements require high driving voltages, and have low luminance of the emitted light and emission efficiency. However, various technologies have recently been reported to solve these problems.

For example, in Japanese Patent Application Laid-Open (JP-A) No. 2006-121032, there is disclosed an organic electroluminescence element that includes a light-emitting layer containing 4,4'-N,N'-dicarbazole-biphenyl (CBP) as a host material, a platinum complex as a blue phosphorescent light-emitting material, and a platinum complex as a red phosphorescent light-emitting material.

It is generally known that the platinum complex (the platinum complex with 4 ligands) has a two-dimensional structure. When the platinum complex is used, molecules of the platinum complex were stacked to each other. Therefore, the distance between the molecules is short compared to cases when an iridium complex is used.

Moreover, it is considered that the shorter the distance between the molecules is, the more easily interaction between the molecules occurs. Therefore, if the blue platinum complex is used in combination with the red platinum complex, the distance between molecules thereof is shorter, resulting in a light-emitting layer in which energy is easily transferred.

For this reason, when two platinum complexes are used as a blue phosphorescent light-emitting material and red phosphorescent light-emitting material, energy is easily transferred to the red phosphorescent light-emitting material compared to the case where a combination of a platinum complex and iridium complex is used. In this case, the resulted organic electroluminescence element does not emit white light unless an amount of the red phosphorescent light-emitting material contained therein is significantly reduced.

Moreover, in Proceeding of ASID '06 pp. 50-52, there is disclosed a white organic electroluminescence element that includes a light-emitting layer doped with phosphorescent light-emitting compounds such as iridium (III) bis(4,6-difluorophenyl)-pyridinate-N, $C^2$)picolinate(Firpic), and bis(2-(2'-benzo[4,5a]-thienyl)pyridinate-N,$C^{3'}$)iridinium(acety-lacetonate)(Ir(btp)$_2$(acac)).

However, the organic electroluminescence element disclosed in Proceeding of ASID '06 pp. 50-52 has a problem in endurance as it uses two Ir complexes.

BRIEF SUMMARY OF THE INVENTION

The present invention solves various problems in the art, and achieves the following object. Namely, the object of the present invention is to provide an organic electroluminescence element that is a white luminescence element having high and excellent endurance.

A means for solving the aforementioned problems are as follows:

<1> An organic electroluminescence element, containing:

at least one pair of electrodes;

at least one organic light-emitting layer disposed between the electrodes, the organic light-emitting layer comprising two phosphorescent light-emitting materials and a charge-transporting material, wherein the organic light-emitting element is a white organic light-emitting element, and the charge-transporting material is a hole-transporting material, and wherein one of the two phosphorescent light-emitting materials is a platinum complex expressed by the following general formula 1, and the other is an iridium complex expressed by any one of the following general formulae 2A to 2C:

General formula 1

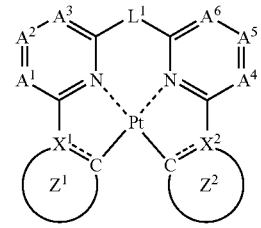

where $L^1$ is a single bond or a bivalent bridging group; $A^1$ to $A^6$ are each independently C—R or N in which R is a hydrogen atom or a substituent; $X^1$ and $X^2$ are each independently C or N; $Z^1$ and $Z^2$ are each independently a 5-member or 6-member aromatic ring formed together with X—C, or a 5-member or 6-member heterocyclic aromatic ring formed together with X—C, General formula 2A

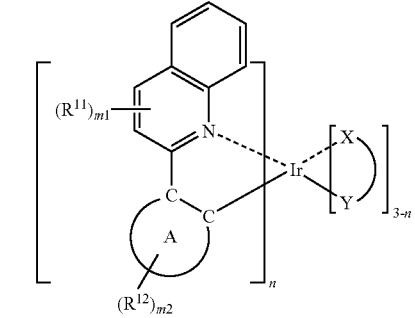

-continued

General formula 2B

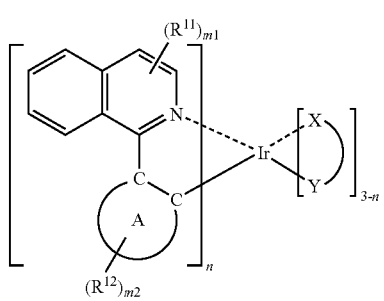

General formula 2C

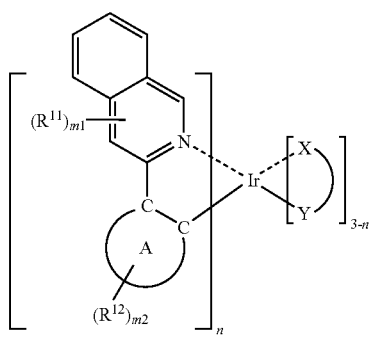

where n is an integer of 1 to 3; X—Y is a bidentate ligand; a ring A is a ring structure which may contain at least one selected from the group consisting of a nitrogen atom, a sulfur atom, and an oxygen atom; $R^{11}$ is a substitute, m1 is an integer of 0 to 6, and in the case where m1 is 2 or more, a plurality of $R^{11}$s adjacent to each other may bond to form a ring, which may contain at least one selected from the group consisting of a nitrogen atom, a sulfur atom, and an oxygen atom, and may further contain one or more substituents; $R^{12}$ is a substituent, m2 is an integer of 0 to 4, and in the case where m2 is 2 or more, a plurality of $R^{12}$s adjacent to each other may bond to form a ring, which may contain at least one selected from the group consisting of a nitrogen atom, a sulfur atom, and an oxygen atom, and may further contain one or more substituents; and $R^{11}$ and $R^{12}$ may bond to each other to form a ring, which may contain at least one selected from the group consisting of a nitrogen atom, a sulfur atom, and an oxygen atom, and may further contain one or more substituents.

<2> The organic electroluminescence element according to <1>, wherein the platinum complex is expressed by the following general formula 4:

General formula 4

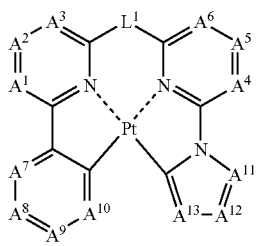

where $A^1$ to $A^{13}$ are each independently C—R or N in which R is a hydrogen atom or a substituent; and $L^1$ is a single bond or a divalent bridging group.

<3> The organic electroluminescence element according to <2>, wherein the platinum complex is expressed by any one of the following structural formulae 1 to 3:

Structural formula 1

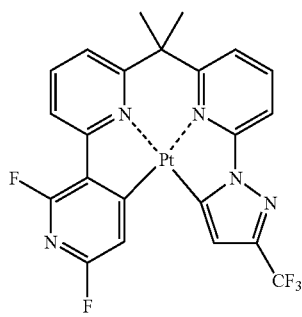

Structural formula 2

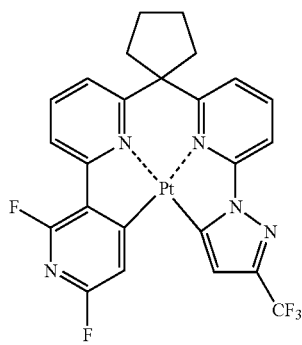

Structural formula 3

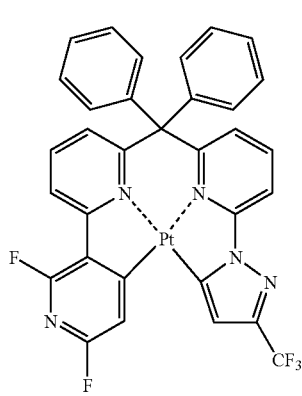

<4> The organic electroluminescence element according to <1>, wherein the platinum complex is expressed by the following general formula 5:

General formula 5

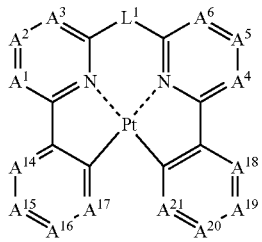

where $A^1$ to $A^6$ and $A^{14}$ to $A^{21}$ are each independently C—R or N in which R is a hydrogen atom or a substituent; and $L^1$ is a single bond or a divalent bridging group.

<5> The organic electroluminescence element according to <4>, wherein the platinum complex is expressed by any one of the following structural formulae 4 to 6:

Structural formula 4

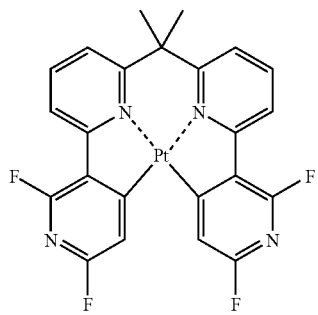

Structural formula 5

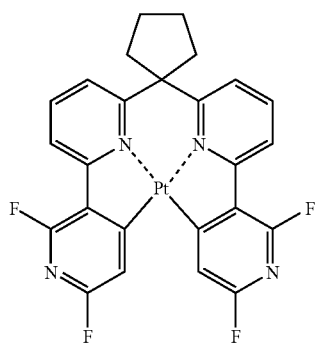

Structural formula 6

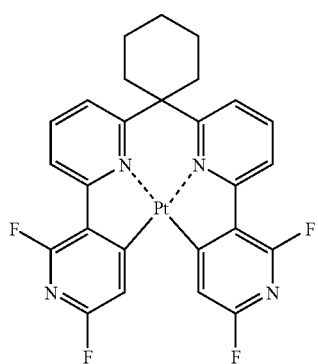

<6> The organic electroluminescence element according to any one of <1> to <5>, wherein in the general formulae 2A to 2C, n is 1 or 2, and the bidentate ligand is a monoanionic bidentate ligand.
<7> The organic electroluminescence element according to <6>, wherein the monoanionic bidentate ligand is at least one selected from the group consisting of picolinate, acetylacetonate, and dipivaloylmethanate.
<8> The organic electroluminescence element according to any one of <6> to <7>, wherein the iridium complex is expressed by any one of the following structural formulae 7 to 9:

Structural formula 7

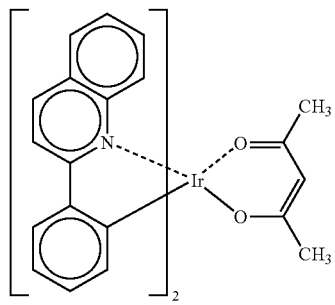

Structural formula 8

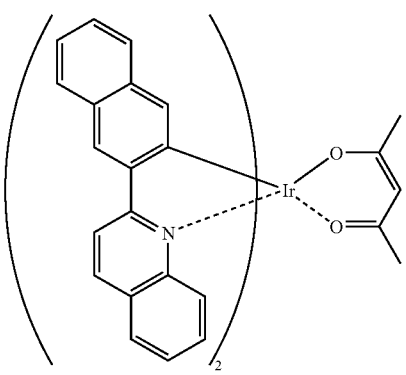

Structural formula 9

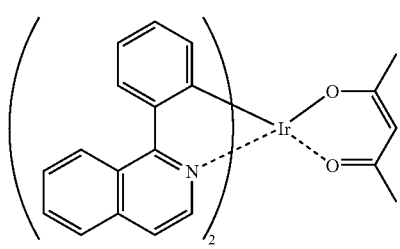

<9> The organic electroluminescence element according to any one of <1> to <5>, wherein in the general formulae 2A to 2C, n is 3.
<10> The organic electroluminescence element according to <9>, wherein the iridium complex is expressed by the following structural formula 10:

Structural formula 10

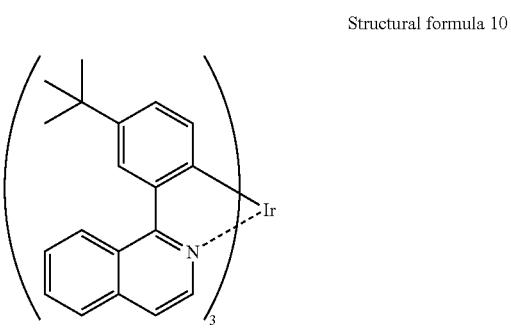

<11> The organic electroluminescence element according to any one of <1> to <10>, wherein the iridium complex is contained in an amount of 0.2% by mass to 2.0% by mass relative to the total mass of all the compounds contained in the organic light-emitting layer.

<12> The organic electroluminescence element according to any one of <1> to <11>, wherein the charge-transporting material is at least one selected from the group consisting of a pyrrole derivative, a carbazole derivative, a triazole derivatives, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a phthalocyanine compound, a porphyrin compound, a thiophene derivative, an organosilane derivative, and carbon.

<13> The organic electroluminescence element according to <12>, wherein the charge-transporting material is the carbazole derivative or the arylamine derivative.

<14> The organic electroluminescence element according to <13>, wherein the charge-transporting material is the carbazole derivative.

<15> The organic electroluminescence element according to <14>, wherein the charge-transporting material is expressed by any one of the following structural formulae 11 to 13:

Structural formula 11

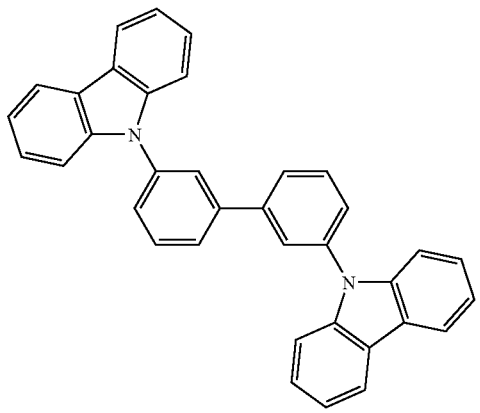

Structural formula 12

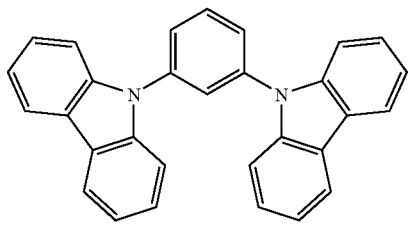

Structural formula 13

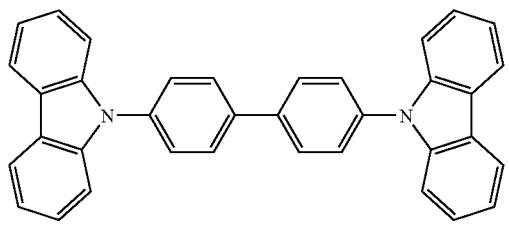

<16> The organic electroluminescence element according to any one of <1> to <15>, further comprising a hole-transport layer and an electron-transport layer, wherein the hole-transport layer, the organic light-emitting layer, and the electron-transport layer are laminated in this order from the side of the anode.

<17> The organic electroluminescence element according to <16>, wherein the hole-transport layer has a thickness of 1 nm to 500 nm.

<18> The organic electroluminescence element according to any of <16> or <17>, wherein the electron-transport layer has a thickness of 1 nm to 500 nm.

The present invention solves the various problems in the art, achieves the aforementioned object, and provides an organic electroluminescence element that is a white luminescence element having high adaptability on production and excellent endurance.

DETAILED DESCRIPTION OF THE INVENTION

An organic electroluminescence element of the invention will be explained hereinafter.

(Organic Electroluminescence Element)

The organic electroluminescence element (organic EL element) of the invention contains a cathode, an anode (a transparent electrode and a counter electrode), and an organic compound layer which includes a light-emitting layer (organic light-emitting layer), and disposed between the electrodes. Considering the characteristics of organic electroluminescence elements, it is preferred that at least one of the anode and the cathode be transparent.

As a preferable embodiment of a laminate structure of the organic compound layer, a hole-transport layer, the organic light-emitting layer, and an electron-transport layer are laminated in this order from the side of the anode. Moreover, it is preferred that a hole-injection layer be disposed between the hole-transport layer and the anode, and/or an electron-transport intermediate layer be disposed between the organic light-emitting layer and the electron-transport layer. Furthermore, a hole-transport intermediate layer is disposed between the organic light-emitting layer and the hole-transport layer, and an electron-injection layer may be disposed between the cathode and the electron-transport layer.

Note that, each layer may be further separated into a plurality of secondary layers.

—Anode—

An anode may be suitably selected from electrode materials known in the art depending on the intended use or purpose without any restriction on its shape, structure, size or the like, provided that it functions as an electrode for providing holes to the organic compound layer. As mentioned earlier, the anode is generally provided as a transparent anode.

Preferable examples of the material for forming the anode include metals, alloys, metal oxides, conductive compounds, and mixtures thereof. Specific examples of the material for forming the anode include: conductive metal oxides such as tin oxides doped with, for example, antimony and fluorine (ATO and FTO), tin oxide, zinc oxide, indium oxide, indium tin oxide (ITO) and indium zinc oxide (IZO); metals such as gold, silver, chromium and nickel; mixtures or laminates of these metals and the conductive metal oxides; inorganic conductive materials such as copper iodide and copper sulfide; organic conductive materials such as polyaniline, polythiophene and polypyrrole; and laminates of these materials and ITO. Among them, conductive metal oxides are preferable. In particular, ITO is preferable for its productivity, high conductivity, and transparency.

The anode may be formed on a substrate by a method suitably selected from known methods in the art, depending on the material for forming the anode and applicability of the method to be selected. Examples of such known methods include: wet methods such as printing, and coating; physical methods such as vacuum deposition, sputtering, and ion-plating; and chemical methods such as CVD, and plasma CVD. For example, when ITO is used as the material for the anode, the anode may be formed by DC or high-frequency sputtering, vacuum deposition, or ion-plating.

The location of the anode within the organic EL element may be suitably selected depending on use of the organic EL element or intended purpose, without any restriction. The anode is preferably formed on the substrate. In this case, the anode may be formed on the entire surface of the substrate, or a part of the surface thereof.

Patterning for forming the anode may be carried out by chemical etching such as photolithography, or physical etching such as etching by laser. Alternatively, the patterning may be carried out by vacuum deposition or sputtering using a mask, or by lift-off or printing.

The thickness of the anode may be suitably adjusted depending on the material for forming the anode, and cannot be determined unconditionally. The thickness of the anode is generally about 10 nm to 50 µm, preferably 50 nm to 20 µm.

The ohmic value of the anode is preferably $10^3$ Ω/sq. or less, more preferably $10^2$ Ω/sq. or less. In the case where the anode is transparent, it may be transparent with no color, or with some tints. As the organic EL element is configured so that the emitted light is released from the side of the transparent anode, the transmittance of the anode is preferably 60% or higher, more preferably 70% or higher.

Note that, the details of the transparent anode are described in "New Development of Transparent Conductive Film" (supervised by Yutaka Sawada, and published by CMC Publishing Co., Ltd., in 1999), and these descriptions can be applied to the present invention. In the case where a plastic substrate having low heat resistance is used, the anode is preferably a transparent anode formed at low temperature, e.g. the temperature at 150° C. or lower, using ITO or IZO.

—Cathode—

A cathode may be suitably selected from electrode materials known in the art depending on use of the organic electroluminescence element without any restriction in its shape, structure, size and the like, provided that it functions as an electrode for injecting electrons into the organic compound layer.

Examples of the material for forming the cathode include metals, alloys, metal oxides, conductive compounds, and mixtures thereof. Specific examples thereof include alkali metals (e.g., Li, Na, K and Cs), alkaline earth metals (e.g., Mg and Ca), gold, silver, lead, aluminum; sodium-potassium alloys, lithium-aluminum alloys, magnesium-silver alloys and rare earth metals (e.g., indium and ytterbium). These may be used independently, but preferably in combination for the purpose of favorable stability and electron-injection properties.

Among the materials listed above as the material for forming the cathode, the alkali metals and alkaline earth metals are preferable in terms of the electron-injection properties, and the material containing aluminum as a main component is preferable in terms of excellent storage stability.

The phrase "material containing aluminum as a main component" refers to a material composed of aluminum alone; alloys containing aluminum and 0.01% by mass to 10% by mass of an alkali or alkaline earth metal; or the mixtures thereof (e.g., lithium-aluminum alloys and magnesium-aluminum alloys).

Materials for forming cathodes are disclosed in JP-A Nos. 02-15595 and 05-121172, and the materials listed therein can be also used in the present invention.

The cathode may be formed on a substrate by the method suitably selected from known methods in the art, depending on the material for forming the cathode and applicability of the method to be selected. Examples of such known methods include: wet methods such as printing, and coating; physical methods such as vacuum deposition, sputtering, and ion-plating; and chemical methods such as CVD, and plasma CVD. For example, when one or more metals are used as the material for the cathode, the cathode may be formed by simultaneously or successively sputtering the one or more metals.

Patterning for forming the cathode may be carried out by chemical etching such as photolithography, or physical etching such as etching by laser. Alternatively, the patterning may be carried out by vacuum deposition or sputtering using a mask, or by lift-off or printing.

The location of the cathode within the organic EL element may be suitably selected without any restriction. The cathode may be formed on the entire surface of the organic compound layer, or a part of the surface thereof.

Moreover, a dielectric layer may be disposed between the cathode and the organic compound layer, and such dielectric layer is formed of fluoride or oxide of alkali metal or alkaline earth metal, and has a thickness of 0.1 nm to 5 nm. This dielectric layer can be regarded as one type of an electron-injection layer. The dielectric layer can be formed by vacuum deposition, sputtering, or ion-plating.

The thickness of the cathode may be suitably adjusted depending on the material for forming the cathode, and cannot be determined unconditionally. The thickness of the cathode is generally about 10 nm to 5 µm, preferably 50 nm to 1 µm.

The cathode may be transparent or opaque. The transparent cathode can be formed by forming a thin film having a thickness of 1 nm to 10 nm using the material for the cathode, and on the film, depositing a transparent conductive material such as ITO and IZO.

—Organic Compound Layer—

The organic EL element contains at least one organic compound layer including an organic light-emitting layer. Examples of layers to be contained in the organic compound layer, other than the organic light-emitting layer, include a hole-transport layer, an electron-transport layer, a hole-blocking layer, an electron-blocking layer, a hole-injection layer, and an electron-injection layer.

The layers constituting the organic compound layer in the organic EL element can be each suitably formed by a dry film-forming method such as vapor deposition, and sputtering, wet coating, transferring, printing, coating, inkjet printing, or spraying.

——Organic Light-Emitting Layer——

The light-emitting layer has the function of receiving holes from the anode, the hole-injection layer, or the hole-transport layer, receiving electrons from the cathode, the electron-injection layer, or the electron-transport layer, and providing a field for recombination of the holes with the electrons for light emission, when an electric field is applied.

The organic light-emitting layer contains two phosphorescent light-emitting materials and a charge-transporting material, and may further contain other substances, if necessary.

——Phosphorescent Light-Emitting Material——

The phosphorescent light-emitting materials may be suitably selected depending on the intended purpose without any restriction, provided that one of them is a platinum complex and the other is an iridium complex. The phosphorescent light-emitting material contributes to emission of light.

The amount of the phosphorescent light-emitting material is preferably 0.3% by mass to 50% by mass, more preferably 1% by mass to 40% by mass, even more preferably 3% by mass to 30% by mass, relative to the total amount of all the compounds contained in the organic light-emitting layer.

When the amount thereof is less than 0.3% by mass, the proportion of the injected charges to be used for emission of the light-emitting material may be low, and the charge-transporting material may emit light in some cases. When the amount thereof is more than 50% by mass, although it depends on the phosphorescent light-emitting materials for use, the light-emitting materials are associated to each other, resulted in emission of an unexpected spectrum.

The platinum complex may be suitably selected depending on the intended purpose without any restriction, provided that it is expressed by the following general formula 1, but is preferably expressed by any of the following general formulae 4 to 5.

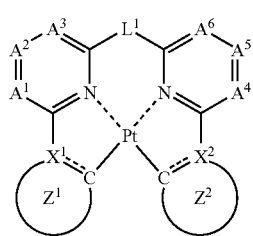

General formula 1

In the general formula 1, $L^1$ is a single bond or a bivalent bridging group; $A^1$ to $A^6$ are each independently C—R or N in which R is a hydrogen atom or a substituent; $X^1$ and $X^2$ are each independently C or N; $Z^1$ and $Z^2$ are each independently a 5-member or 6-member aromatic ring formed together with X—C, or a 5-member or 6-member heterocyclic aromatic ring formed together with X—C.

Substituents denoted as R may be suitably selected depending on the intended purpose without any restriction. Examples of such substituents include a halogen atom, an alkoxy group, an amino group, an alkyl group, a cycloalkyl group, a halogenated alkyl group, an aryl group which may contain a nitrogen atom or a sulfur atom, and an aryloxy group which may contain a nitrogen atom or a sulfur atom. These may further contain one or more substituents.

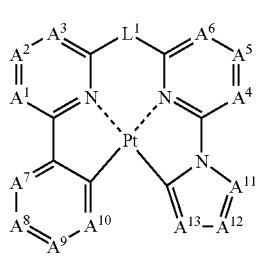

General formula 4

In the general formula 4, $A^1$ to $A^{13}$ are each independently C—R or N in which R is a hydrogen atom or a substituent; and $L^1$ is a single bond or a divalent bridging group.

Substituents denoted as R may be suitably selected depending on the intended purpose without any restriction. Examples of such substituents include a halogen atom, an alkoxy group, an amino group, an alkyl group, a cycloalkyl group, a halogenated alkyl group, an aryl group which may contain a nitrogen atom or a sulfur atom, and an aryloxy group which may contain a nitrogen atom or a sulfur atom. These may further contain one or more substituents.

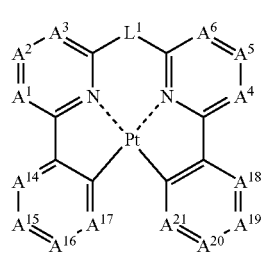

General formula 5

In the general formula 5, $A^1$ to $A^6$ and $A^{14}$ to $A^{21}$ are each independently C—R or N in which R is a hydrogen atom or a substituent; and $L^1$ is a single bond or a divalent bridging group.

Substituents denoted as R may be suitably selected depending on the intended purpose without any restriction. Examples of such substituents include a halogen atom, an alkoxy group, an amino group, an alkyl group, a cycloalkyl group, a halogenated alkyl group, an aryl group which may contain a nitrogen atom or a sulfur atom, and an aryloxy group which may contain a nitrogen atom or a sulfur atom. These may further contain one or more substituents.

Specific examples of the compound expressed by the general formula 4 include compounds expressed by the structural formulae 1 to 3:

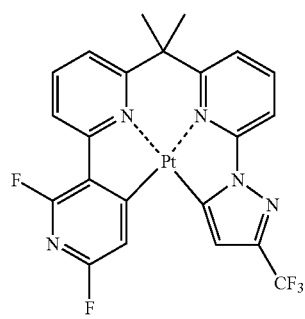

Structural formula 1

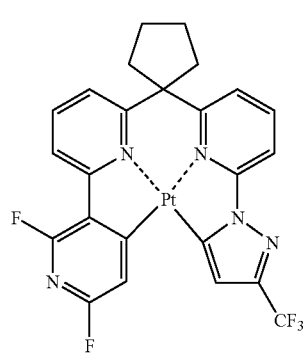

Structural formula 2

-continued

Structural formula 3

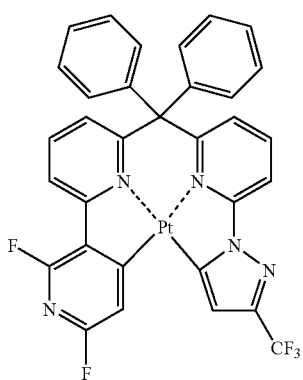

Specific examples of the compound expressed by the general formula 5 include compounds expressed by the following structural formulae 4 to 6:

Structural formula 4

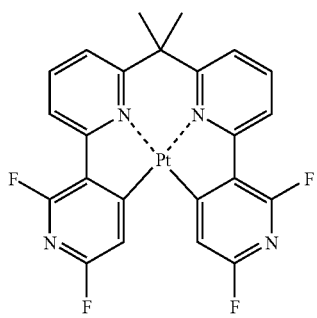

Structural formula 5

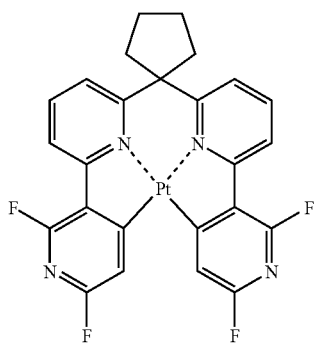

Structural formula 6

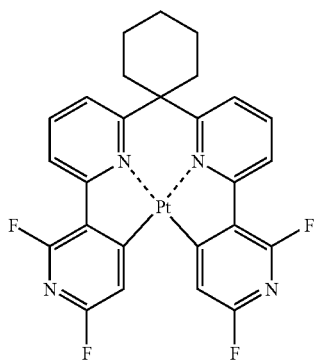

The iridium complex may be suitably selected depending on the intended purpose without any restriction, provided that it is expressed by any one of the following general formulae 2A to 2C.

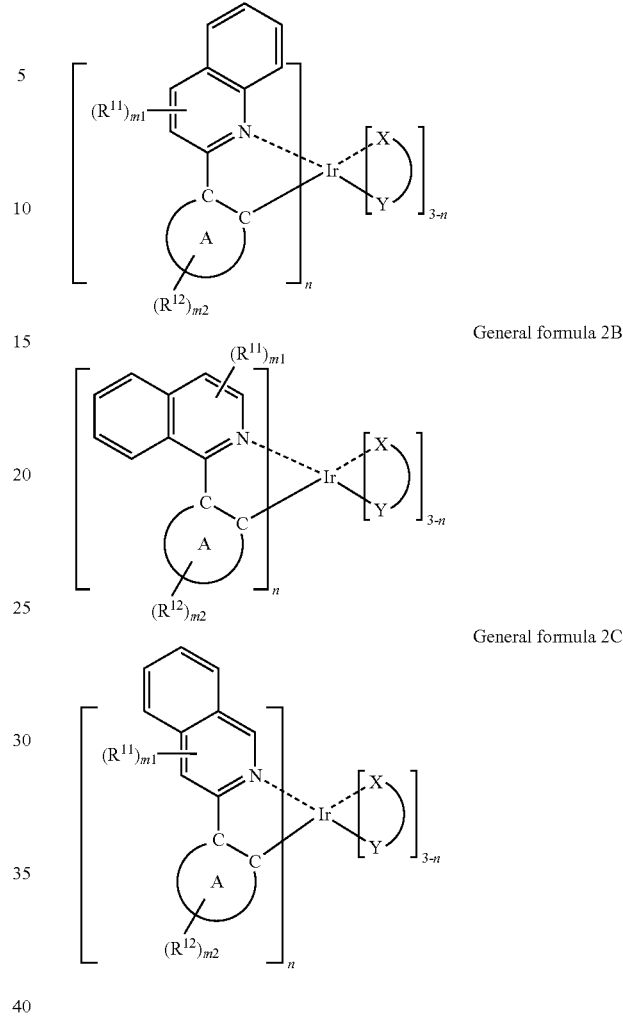

In the general formulae 2A to 2C, n is an integer of 1 to 3; X—Y is a bidentate ligand; a ring A is a ring structure which may contain at least one selected from the group consisting of a nitrogen atom, a sulfur atom, and an oxygen atom; $R^{11}$ is a substitute, m1 is an integer of 0 to 6, and in the case where m1 is 2 or more, a plurality of $R^{11}$s adjacent to each other may bond to form a ring, which may contain at least one selected from the group consisting of a nitrogen atom, a sulfur atom, and an oxygen atom, and may further contain one or more substituents; $R^{12}$ is a substituent, m2 is an integer of 0 to 4, and in the case where m2 is 2 or more, a plurality of $R^{12}$s adjacent to each other may bond to form a ring, which may contain at least one selected from the group consisting of a nitrogen atom, a sulfur atom, and an oxygen atom, and may further contain one or more substituents; and $R^{11}$ and $R^{12}$ may bond to each other to form a ring, which may contain at least one selected from the group consisting of a nitrogen atom, a sulfur atom, and an oxygen atom, and may further contain one or more substituents.

The ring A denotes a ring structure, which may contain at least one selected from the group consisting of a nitrogen atom, a sulfur atom, and an oxygen atom, and is preferably a 5-member ring, a 6-member ring, or the like. The ring may contain one or more substituents.

In the case where n is 3 in the general formulae 2A to 2C, the identical ligands are synthesized to form the indium complex, and thus it is preferable in view of the production efficiency. In the case where n is 1 or 2, X—Y denotes a bidentate ligand, and preferable examples thereof include monoanionic bidentate ligands, and the like.

Preferable examples of the monoanionic bidentate ligand include picolinate (pic), acetylacetonate (acac), and dipivaloylmethanate (t-butyl acac).

Examples of the ligand include, other than listed above, ligands disclosed in International Publication No. WO 02/15645 (Lamansky et al., pp. 89-91).

Substituents denoted as $R^{11}$ and $R^{12}$ may be suitably selected depending on the intended purpose without any restriction. Examples thereof include halogen atoms, alkoxy groups, amino groups, alkyl groups, cycloalkyl groups, aryl groups which may contain a nitrogen atom or sulfur atom, and aryloxy groups which may contain a nitrogen atom or sulfur atom. These substituents may further contain one or more substituents therein.

Adjacent $R^{11}$ and $R^{12}$ may bond to each other to form a ring, which may contain at least one selected from the group consisting of a nitrogen atom, a sulfur atom, and an oxygen atom, and may further contain one or more substituents, and examples of each ring include a 5-member ring, and a 6-member ring. These rings may further contain one or more substituents therein.

Specific examples of compounds expressed by the general formulae 2A to 2C are as follows, but not limited thereto.

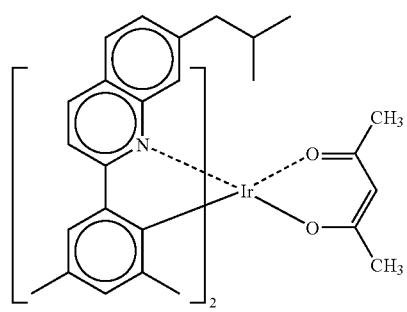
(I-1)

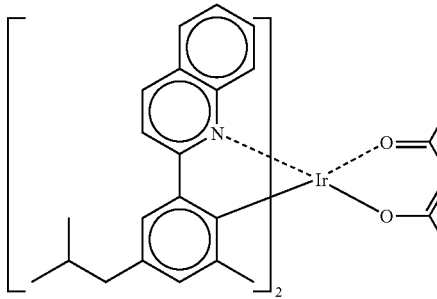
(I-2)

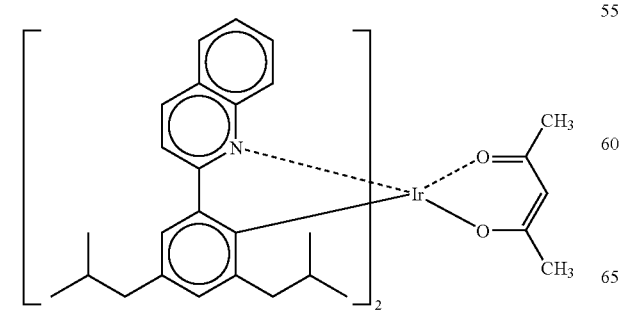
(I-3)

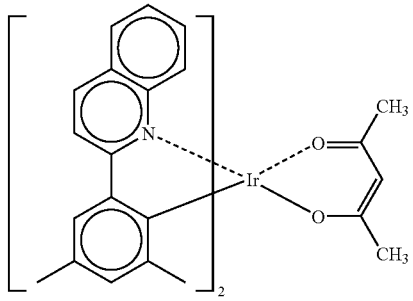
(I-4)

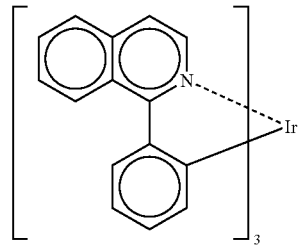
(I-5)

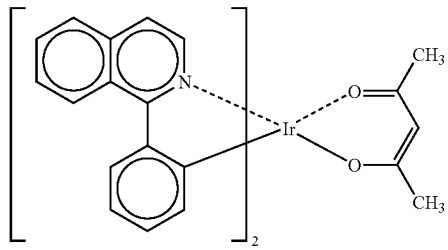
(I-6)

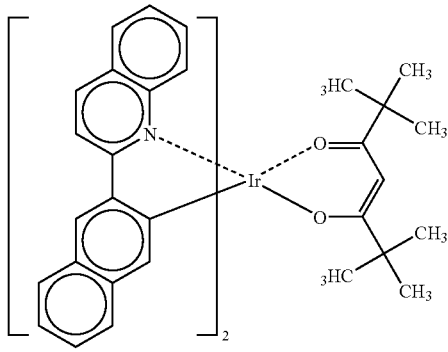
(I-7)

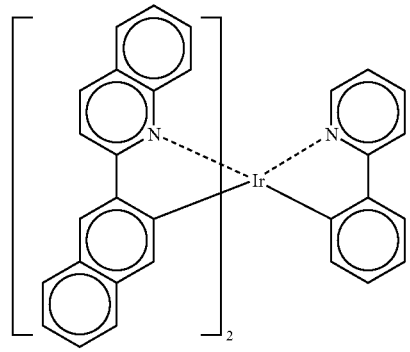
(I-8)

(I-9)
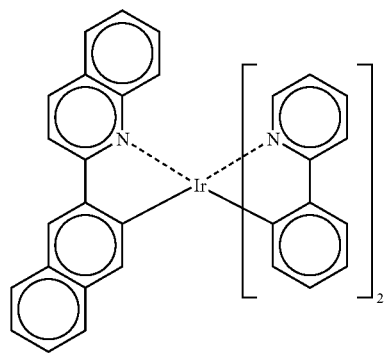
(I-10)
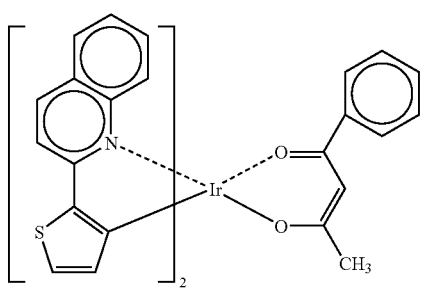
(I-11)
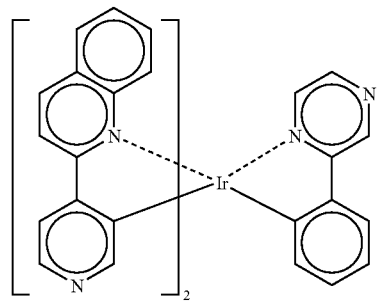
(I-12)
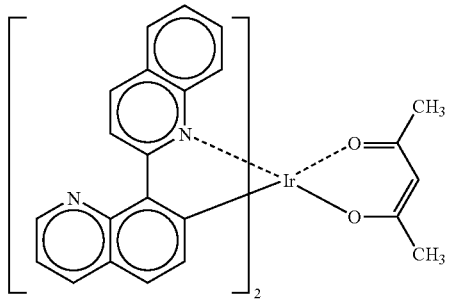
(I-13)
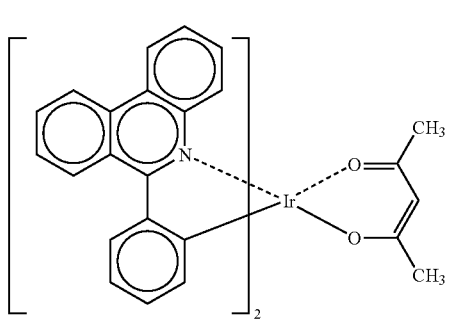
(I-14)
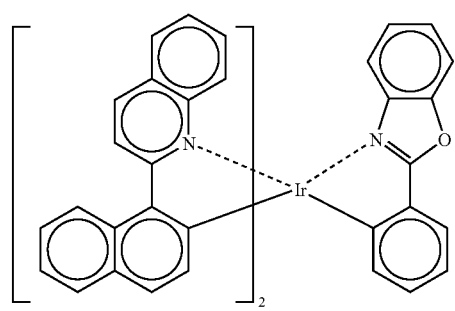
(I-15)
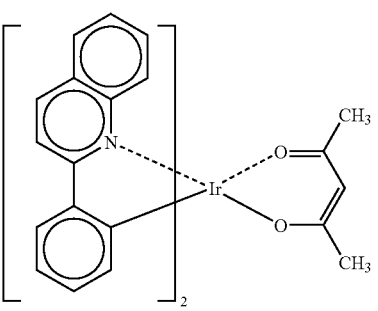
(I-16)
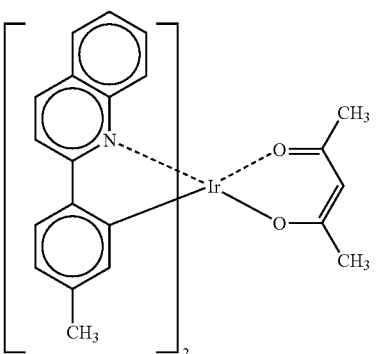
(I-17)
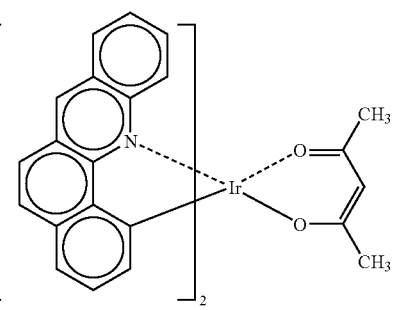
(I-18)
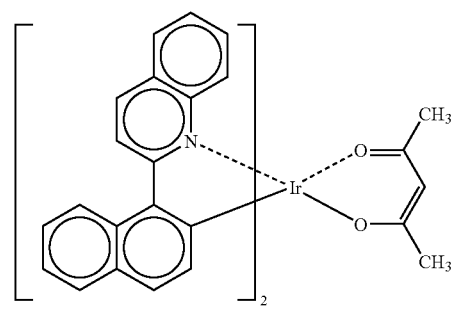

-continued

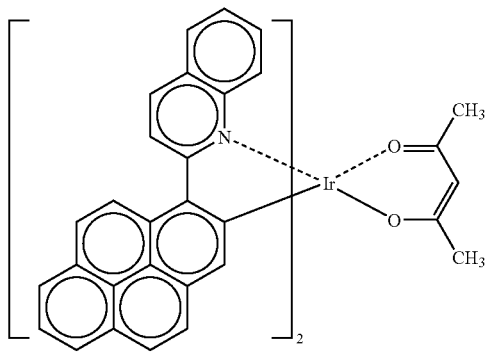 (I-19)

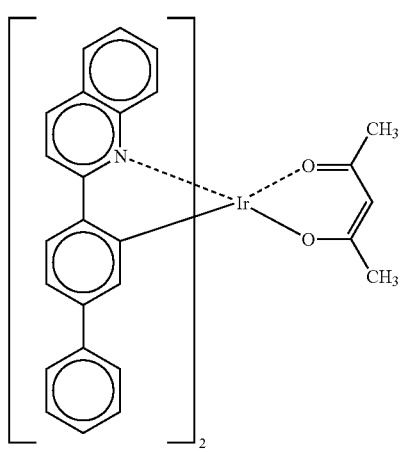 (I-20)

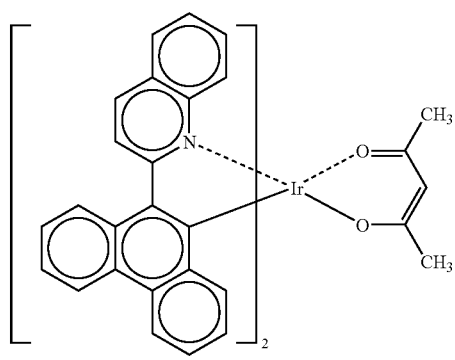 (I-21)

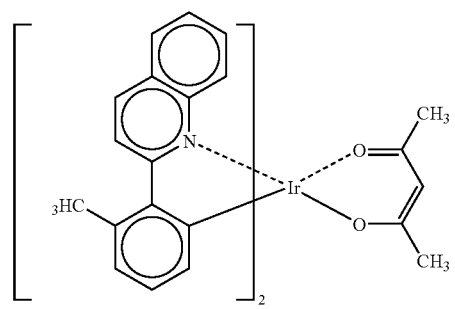 (I-22)

-continued

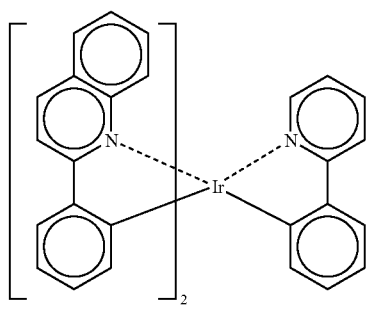 (I-23)

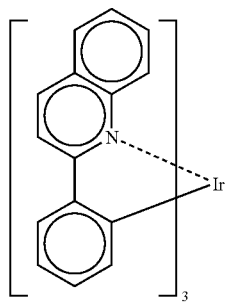 (I-24)

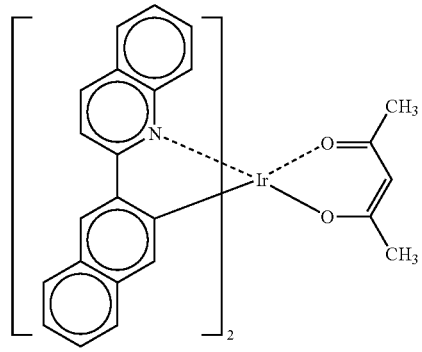 (I-25)

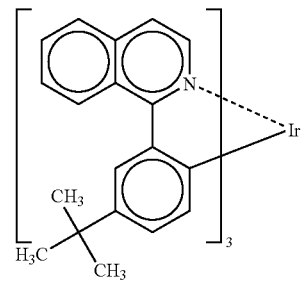 (I-26)

The concentration (amount) of the iridium complex may be suitably adjusted depending on the intended purpose without any restriction, but is preferably 0.2% by mass to 2.0% by mass relative to the total mass of all the materials contained in the organic light-emitting layer.

——Charge-Transporting Material——

The charge-transporting material may be suitably selected depending on the intended purpose without any restriction, provided that it is a hole-transporting material. Specifically, the charge-transporting material can be selected from the materials used for the hole-injection layer and hole-transport layer, which will be described later. Specific examples thereof are as follows.

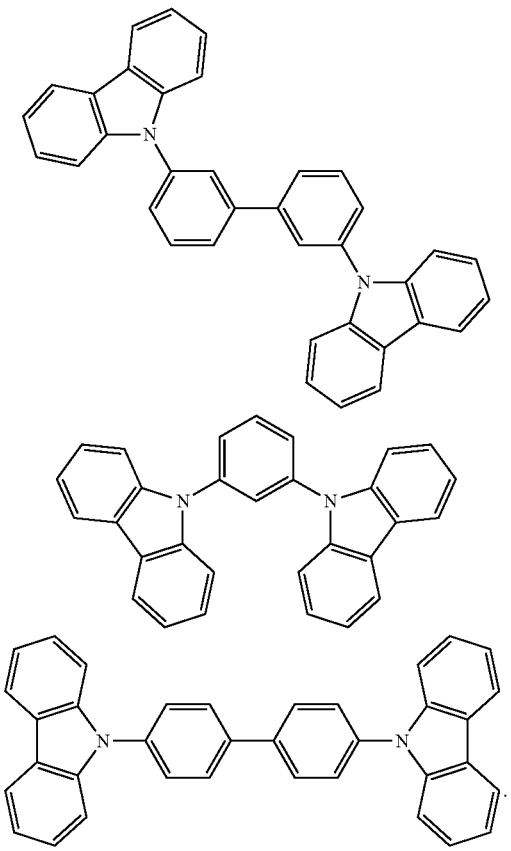

——Hole-Injection Layer and Hole-Transport Layer——

The hole-injection layer and the hole-transport layer each have a function of receiving holes from the anode or the anode side and transporting to the cathode side. A hole-injection material or hole-transport material used for theses layers may be a low-molecular-weight compound or a high-molecular-weight compound. Specific examples of the hole-injection layer and the hole-transport layer are preferably layers containing pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracerie derivatives, fluorenone derivatives, hydrazone derivatives, stilbene derivatives, silazane derivatives, aromatic tertiary amine compounds, styrylamine compounds, aromatic dimethylidine compounds, phthalocyanine compounds, porphyrin compounds, thiophene derivatives, organosilane derivatives and/or carbon. Among them, the carbozole derivative and arylamine derivative are preferable, and the carbozale derivative is more preferable in view of the hole transporting property thereof.

The hole-injection layer and the hole-transport layer, respectively, may contain an electron-accepting dopant. The electron-accepting dopant may be an inorganic compound or an organic compound, provided that it accepts electrons, and has a function of oxidizing organic compounds.

Specifically, examples of the inorganic compound include: metal halides, such as ferric chloride, aluminum chloride, gallium chloride, indium chloride and antimony pentachloride; and metal oxides such as vanadium pentaoxide and molybdenum trioxide.

Examples of the organic compound include: those having a substituent such as a nitro group, a halogen atom, a cyano group and a trifluoromethyl group; quinone compounds; acid anhydride compounds; and fullerenes.

Suitable examples thereof include, other than those listed above, compounds disclosed in JP-A Nos. 06-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, and 2005-209643.

Among them, preferable compounds are hexacyanobutadiene, hexacycnobenzene, tetracycnoethylene, tetracycnoquinodimethane, tetrafluorotetracycnoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and C60 fullerene, more preferable compounds are hexacycnobutadiene, hexacycnobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine, and a particularly preferable compound is tetrafluorotetracyanoquinodimethane.

These electron-accepting dopants may be used independently, or in combination. Although the amount thereof to be used may change depending on the material(s) used as the electron-accepting dopant(s), the amount thereof is preferably 0.01% by mass to 50% by mass, more preferably 0.05% by mass to 20% by mass, even more preferably 0.1% by mass to 10% by mass relative to the amount of the materials for forming the hole-transport layer.

The hole-injection layer and hole-transport layer each preferably have a thickness of 500 nm or less from the standpoint of its contribution to the reduction in the driving voltage.

The thickness of the hole-transport layer is preferably 1 nm to 500 nm, more preferably 5 nm to 200 nm, even more preferably 10 nm to 100 nm. The thickness of the hole-injection layer is preferably 0.1 nm to 200 nm, more preferably 0.5 nm to 100 nm, even more preferably 1 nm to 100 nm.

The hole-injection layer and hole-transport layer may both be of a monolayer structure forming of one or more materials mentioned above, or of a laminate structure having a plurality of layers each formed of identical or different compositions.

——Electron-Injection Layer and Electron-Transport Layer——

The electron-injection layer and electron-transport layer both have a function of receiving electrons from the anode side and transport to the cathode side. An electron-injecting material and an electron-transporting material used for these layers may be low-molecular weight compounds or high-molecular weight compounds.

Specifically, examples of the electron-injection layer and electron-transport layer are layers containing pyridine derivetives, quinoline detivetives, pyrimidine derivedives, pyradine derivatives, phthalazine derivatives, phenanthroline derivatives, triazine derivatives, triazole derivatives, oxazole derivatives, oxadiazole derivatives, imidazole detrivatives, fluorenone derivatives, anthraquinodimehane derivatives, anthrone derivatives, diphenylquinone derivatives, thiopyrandioxide derivatives, carbodiimide derivatives, fluorenylidenemethane derivatives, distyrylpyradine derivatives, aromatic tetracarboxylic acid anhydride such as naphthalene and perylene, phthalocyanine derivatives, metal complexs such as 8-quinolinol derivatives, various metal complexes such as metal phthalocyanine and metal complex containing benzoxazole or benzothiazole as a ligand, and organic silane derivatives such as silole.

The electron-injection layer or electron-transport layer may contain an electron-donating dopant.

The electron-donating dopant may be suitably selected from alkai metals such as Li, alkaline earth metals such as Mg, transition metals including rare metals, and reducing organic compounds, provided that it donates electrons and has a function of reducing organic compound. As the metals, metals having work function of 4.2 eV or less are particularly preferably used, and specific examples of such metals include Li, Na, K, Be, Mg, Ca, Sr, Ba, Y, Cs, La, Sm, Gd, and Yb. Moreover, examples of the reducing organic compounds include nitrogen-containing compounds, sulfur-containing compounds, and phosphorous-containing compounds.

Other than those listed above, materials disclosed in JP-A Nos. 06-212153, 2000-196140, 2003-68468, 2003-229278, and 2004-342614 can be used.

These electron-donating dopants may be used independently or in combination. The amount of the electron-donating dopant(s) to be used may change depending on the material(s) for the electron-donating dopant(s), but is preferably 0.1% by mass to 99% by mass, more preferably 1.0% by mass to 80% by mass, even more preferably 2.0% by mass to 70% by mass relative to the amount of the materials for forming the electron-transporting layer.

The electron-injection layer and electron-transport layer each preferably have a thickness of 500 nm or less from the standpoint of its contribution to the reduction in driving voltage.

The thickness of the electron-transport layer is preferably 1 nm to 500 nm, more preferably 5 nm to 200 nm, even more preferably 10 nm to 100 nm. The thickness of the electron-injection layer is preferably 0.1 nm to 200 nm, more preferably 0.2 nm to 100 nm, even more preferably 0.5 nm to 50 nm.

The electron-injection layer and electron-transport layer may both be of a monolayer structure forming of one or more materials mentioned above, or of a laminate structure having a plurality of layers each formed of identical or different compositions.

——Hole-Blocking Layer——

The hole-blocking layer has a function of preventing holes transported from the anode size to the light-emitting layer from passing through to the cathode side, and is generally provided as an organic layer adjacent to the light-emitting layer on the cathode side.

Examples of the compound for forming the hole-blocking layer include: aluminum complexes such as BAlq; triazole derivatives; and phenanthroline derivatives such as BCP.

The thickness of the hole-blocking layer is preferably 1 nm to 500 nm, more preferably 5 nm to 200 nm, even more preferably 10 nm to 100 nm.

The hole-blocking layer may be of a monolayer structure forming of one or more materials mentioned above, or of a laminate structure having a plurality of layers each formed of identical or different compositions.

——Electron-Blocking Layer——

The electron-blocking layer has a function of preventing electrons transported from the cathode size to the light-emitting layer from passing through to the anode side, and is provided as an organic compound layer adjacent to the light-emitting layer on the anode side.

Examples of the compound for forming the electron-blocking layer are those listed above as the hole-transport material.

The thickness of the electron-blocking layer is preferably 1 nm to 500 nm, more preferably 5 nm to 200 nm, even more preferably 10 nm to 100 nm.

The electron-blocking layer may be of a monolayer structure forming of one or more materials mentioned above, or of a laminate structure having a plurality of layers each formed of identical or different compositions.

——Protective Layer——

The organic EL element may be entirely protected with a protective layer.

The materials contained in the protective layer may be suitably selected depending on the intended purpose without any restriction, provided that the resulted protective layer will have a function of preventing water, oxygen, and the like, which promote the degradation of the element, from entering into the element. Examples thereof include: metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as $SiN_x$ and $SiN_xO_y$; metal fluorides such as $MgF_2$, LiF, $AlF_3$ and $CaF_2$; polyethylenes, polypropylenes, polymethyl methacrylates, polyimides, polyureas, polytetrafluoroethylenes, polychlorotrifluoroethylenes, polydichlorodifluoroethylenes, copolymers of chlorotrifluoroethylens and dichlorodifluoroethylenes, copolymers produced through compolymerization of a monomer mixture containing tetrafluoroethylene and at least one comonomer, fluorine-containing copolymers containing a ring structure in the copolymerization main chain, water-absorbing materials each having a water absorption rate of 1% or more, and moisture permeation preventive substances each having a water absorption rate of 0.1% or less.

The formation method of the protective layer is suitably selected depending on the intended purpose without any restriction. Examples thereof include vacuum deposition, sputtering, reactive sputtering, molecular beam epitaxial (MBE), cluster ion beam, ion plating, plasma polymerization (high-frequency excitation ion plating), plasma CVD, laser CVD, thermal CVD, gas source CVD, coating, printing and transferring.

——Driving——

The organic electroluminescence element can emit light when a DC voltage (which, if necessary, may contain AC components) (generally 2 volts to 15 volts) or a DC is applied to between the anode and the cathode.

Driving methods of organic electroluminescence elements are described in JP-A Nos. 02-148687, 06-301355, 05-29080, 07-134558, 08-234685, and 08-241047, Japanese Patent (JP-B) No. 2784615, and U.S. Pat. Nos. 5,828,429, and 6,023,308. The methods described in these publications can be used as a driving method for the organic electroluminescence element of the invention.

The organic EL element may be used in a top-emission configuration in which emitted light is released from the anode side.

Moreover, the organic EL element may have a configuration such that one or more charge-generating layers are disposed between a plurality of light-emitting layers for improving emission efficiency.

The charge-generating layer has a function of generating charges (holes and electrons) when an electric field is applied, as well as a function of injecting the generated charges to the layers adjacent to the charge-generating layer.

Material(s) for forming the charge-generating layer may be selected without any restriction, provided that the resulted layer will have the functions mentioned above. The charge-generating layer may be formed of a single compound, or a mixture of compounds.

Specifically, the material(s) for forming the charge-generating layer may be a material having conductivity, a material having semi-conductivity such as a doped organic layer, or a material having electrical insulating properties, and examples thereof include those listed in JP-A Nos. 11-329748, 2003-272860, and 2004-39617.

Further examples thereof include: transparent conductive materials such as ITO, and indium zinc oxide (IZO); fullerene such as C60 fullerene; conductive organic materials such as oligothiophene; conductive organic compounds such as metal phthalocyanines, non-metal phthalocyanines, metal porphins, and non-metal porphins; metallic materials such as Ca, Ag, Al, Mg/Ag alloy, Al/Li alloy, and Mg/Li alloy; hole-conducting materials; electron-conducting materials; and mixtures thereof.

The hole-conducting material may be, for example, a material in which a hole-transporting organic material (e.g. 2-TNATA, NPD) is doped with an electron-accepting oxidizing agent (e.g. F4-TCNQ, TCNQ, $FeCl_3$), a p-type conductive polymer, or a p-type semiconductor. The electron-conducting material may be, for example, a material in which an electron-transporting organic material is doped with a metal or metal compound having a work function of less than 4.0 eV, an n-type conductive polymer, or an n-type semiconductor. Examples of the n-type semiconductor include n-type Si, n-type CdS, and n-type ZnS. Examples of the p-type semiconductor include p-type Si, p-type CdTe, and p-type CuO.

Moreover, an electrical insulating material such as $V_2O_5$ can be also used for the charge-generating layer.

The charge-generating layer may be formed of a single layer, or a laminate of two or more layers. Examples of the laminate structure include a structure in which a material having conductivity such as a transparent conductive material or metallic material is laminated with a hole-conducting material or electron-conducting material, and a laminate structure of the hole-conducting material and the electron-conducting material.

It is preferred that a thickness and/or material of the charge-generating layer be selected so as to have a transmittance of 50% or more to visible light. The thickness thereof may be suitably selected depending on the intended purpose without any restriction, but is preferably 0.5 nm to 200 nm, more preferably 1 nm to 100 nm, even more preferably 3 nm to 50 nm, particularly preferably 5 nm to 30 nm.

A forming method of the charge-generating layer is not particularly restricted, and the aforementioned forming method of the organic compound layer can be used as the forming method of the charge-generating layer.

As mentioned above, the charge-generating layer is formed between the two or more light-emitting layers. In this case, the charge-generating layer may have a material having a function of injecting charges to the adjacent layer, and such material is provided on the anode side or cathode side of the charge-generating layer. On the anode side of the charge-generating layer, an electron-injecting compound such as BaO, SrO, Li2O, LiCl, LiF, $MgF_2$, MgO, and $CaF_2$ may be deposited for improving electron-injection performance to the layer adjacent to the charge-generating layer on the anode side.

Other than mentioned above, materials for the charge-generating layer can be selected based on the descriptions of JP-A No. 2003-45676, and U.S. Pat. Nos. 6,337,492, 6,107,734, and 6,872,472.

The organic electroluminescence element may have a resonator structure. For example, on a transparent substrate are stacked a multi-layered film mirror composed of a plurality of laminated films having different reflective indices, a transparent or semi-transparent electrode, a light-emitting layer and a metal electrode. The light generated in the light-emitting layer is repeatedly reflected between the multi-layered film mirror and the metal electrode (which serve as reflection plates), and thus is resonated.

In another preferred embodiment, a transparent or semi-transparent electrode and a metal electrode are stacked on a transparent substrate. In this structure, the light generated in the light-emitting layer is repeatedly reflected between the transparent or semi-transparent electrode and the metal electrode (which serve as reflection plates), and thus is resonated.

To form the resonator structure, effective refractive indexes of two reflection plates, refractive index of each layer present between the reflection plates, and an optical path length determined by a thickness are adjusted to have optimal values for attaining a desirable resonance wavelength. A calculation formula for the first embodiment is disclosed in JP-A No. 09-180883, and a calculation formula for the second embodiment is disclosed in JP-A 2004-127795.

EXAMPLES

Examples of the present invention will be explained hereinafter, but these shall not be construed as limiting the scope of the present invention.

Example 1

To a glass substrate on which indium tin oxide (ITO) transparent conductive film had been deposited in the thickness of 150 nm (a product of GEOMATEC Corporation), patterning was carried out by photolithography and hydrochloric acid etching so as to form an anode. The patterned ITO substrate was subjected to ultrasonic washing with acetone, washing with pure water, and ultrasonic washing isopropyl alcohol, followed by drying with nitrogen blow. The substrate was then finally subjected to UV-ozone washing. The washed substrate was placed in a vacuum deposition device, and the inner atmosphere of the device was evacuated until the degree of vacuum to be $2.7 \times 10^{-4}$ Pa or less.

Then, a mixture of 2-TNATA and F4-TCNQ (a mixing ratio: 2-TNATA/F4-TCNQ=99 parts by mass/1 part by mass) was heated within the device, and deposited at the deposition rate of 1 nm/sec. to form a hole-injection layer having a thickness of 130 nm.

On the obtained hole-injection layer, 4,4'-bis[N-(1-naphthyl)-N-phenylamino]biphenyl (α-NPD) presented below was heated by a heater and deposited at the deposition rate of 0.2 nm/sec. to form a hole-transport layer having a thickness of 30 nm.

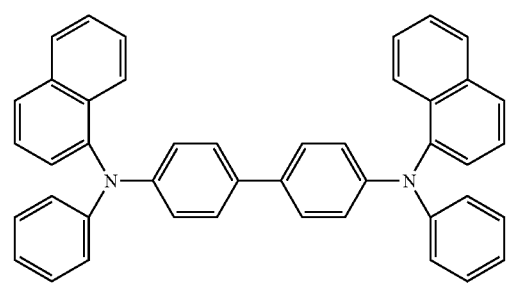

α-NPD

On the obtained hole-transport layer, a charge-transporting material A expressed by the following structural formula as a host material, and a blue phosphorescent light-emitting material A expressed by the following structural formula, and a red phosphorescent light-emitting material A as light-emitting materials were heated and simultaneously deposited to form a light-emitting layer by a three-source deposition. The deposition rate of the charge-transporting material A was controlled to be 0.5 nm/sec., and the light-emitting layer containing the blue phosphorescent light-emitting material A (15% by mass relative to the total mass of the light-emitting layer), and the red phosphorescent light-emitting material A (0.5% by mass relative to the total mass of the light-emitting layer) and having a thickness of 30 nm was formed on the hole-transport layer.

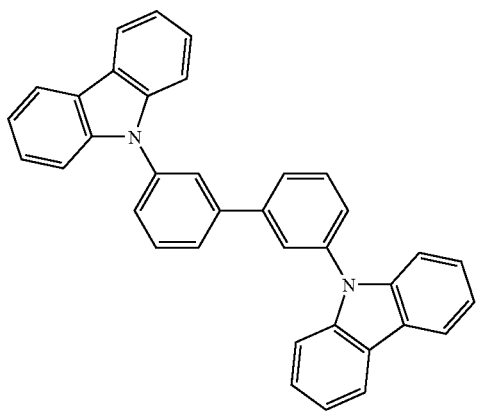

Charge-transporting material A

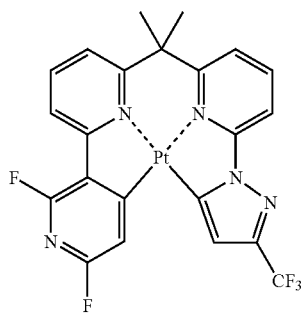

Blue phosphorescent light-emitting material A

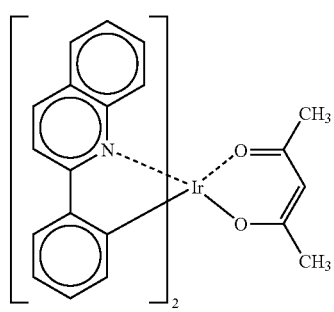

Red phosphorescent light-emitting material A

In addition, the compound (BAlq) expressed by the following structural formula was deposited at the deposition rate of 0.1 nm/sec. to form an electron-transport layer having a thickness of 30 nm on the light-emitting layer.

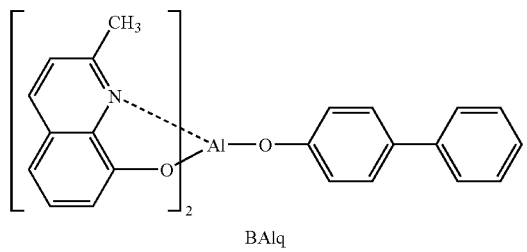

BAlq

Thereafter, lithium fluoride (LiF) was deposited on the electron-transport layer at the deposition rate of 0.1 nm/sec. to have a thickness of 1.5 nm, thereby forming an electron-injection layer. Then, aluminum was deposited on the electron-injection layer at the deposition rate of 0.5 nm/sec. to have a thickness of 200 nm, thereby forming a cathode.

Note that, in order to obtain the predetermined thickness of the film during deposition, the thickness thereof was monitored by a quartz crystal deposition controller (CRTM6000, manufactured by ULVAC Technologies, Inc.).

Next, aluminum lead wires were respectively connected from the anode and cathode.

The obtained element was placed in a glove box an inner atmosphere of which had been replaced with nitrogen gas, without exposing the element to the air. Inside the glove box, 10 mg of calcium oxide powder serving as a moisture absorbent was placed in a concavity formed on an inner side of a sealing cover made of stainless steel, and fixed with an adhesive tape. Using this sealing cover and a UV-ray curable adhesive (XNR5516HV, manufactured by Nagase ChemteX Corporation), the element was sealed.

In this manner, an organic EL element of Example 1 was prepared.

The obtained organic EL element was subjected to an endurance test and a color shift test in the following manners.

<Endurance Test>

The element was driven with a constant current to emit at 1,000 cd/m$^2$, and the time required until luminance of the emitted light was reduced to 500 cd/m$^2$ was determined as endurance of the element. The results are shown in Table 1.

Note that, other examples were evaluated with relative values to 1, which was the value based upon the time of Example 1.

<Color Shift Test>

Color sift between elements in the production (using five elements produced in the same manner) was evaluated in the following manner. The results are shown in Table 1.

Chromaticities of five elements each produced in the same manner were respectively regarded as $(x_1, y_1)$, $(x_2, y_2)$, $(x_3, y_3)$, $(x_4, y_4)$, and $(x_5, y_5)$, and the average of these five points was determined as $(x_a, y_a)$. The value Δ was calculated by the following formula 1, and it was evaluated that the smaller the value Δ was the less shift there was. The element was evaluated as A when the value Δ expressed by the following formula 1 was less than 0.05, B when the value Δ being 0.05 or more but less than 0.07, C when the value Δ being 0.07 or more.

$$\Delta = \sum_{i=1}^{5} \sqrt{(x_i - x_a)^2 + (y_i - y_a)^2} \Big/ 5 \quad \text{Formula 1}$$

Example 2

An organic EL element of Example 2 was prepared in the same manner as in Example 1, provided that the blue phosphorescent light-emitting material A used in Example 1 was replaced with the blue phosphorescent light-emitting material B expressed by the following structural formula. The obtained organic EL element was subjected to the endurance test and color shift test in the manner mentioned above. The results are shown in Table 1.

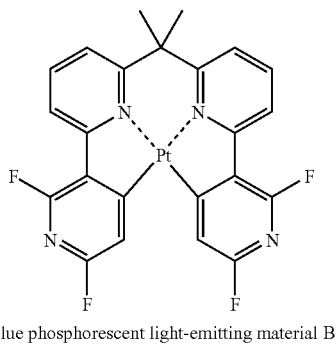

Blue phosphorescent light-emitting material B

Example 3

An organic EL element of Example 3 was prepared in the same manner as in Example 1, provided that the charge-transporting material A used in Example 1 was replaced with the charge-transporting material B expressed by the following structural formula. The obtained organic EL element was subjected to the endurance test and color shift test in the manner mentioned above. The results are shown in Table 1.

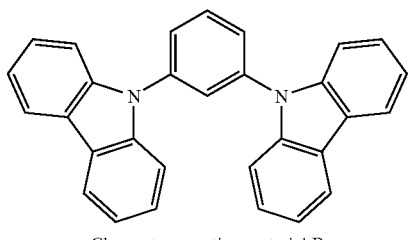

Charge-transporting material B

Example 4

An organic EL element of Example 4 was prepared in the same manner as in Example 3, provided that the blue phosphorescent light-emitting material A used in Example 3 was replaced with the blue phosphorescent light-emitting material B. The obtained organic EL element was subjected to the endurance test and color shift test in the manner mentioned above. The results are shown in Table 1.

Comparative Example 1

An organic EL element of Comparative Example 1 was prepared in the same manner as in Example 1, provided that the blue phosphorescent light-emitting material A used in Example 1 was replaced with the blue phosphorescent light-emitting material C expressed by the following structural formula, and the red phosphorescent light-emitting material A used in Example 1 was replaced with the red phosphorescent light-emitting material C expressed by the following structural formula. The obtained organic EL element was subjected to the endurance test and color shift test in the manner mentioned above. The results are shown in Table 1.

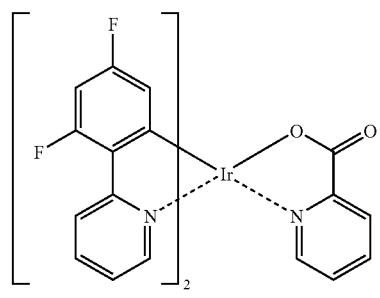

Blue phosphorescent light-emitting material C

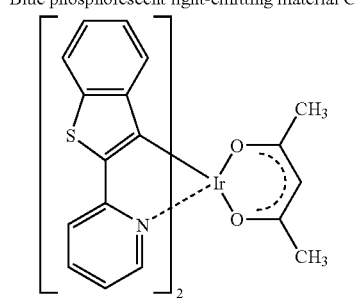

Red phosphorescent light-emitting material C

Comparative Example 2

An organic EL element of Comparative Example 2 was prepared in the same manner as in Example 1, provided that instead of depositing the light-emitting layer containing 15% by mass of the blue phosphorescent light-emitting material A and 1.0% by mass of the red phosphorescent light-emitting material A on the hole-transport layer as in Example 1, a light-emitting layer containing 15% by mass of the blue phosphorescent light-emitting material B and 0.03% by mass of the red phosphorescent light-emitting material B expressed by the following structural formula was deposited on the hole-transport layer. The obtained organic EL element was subjected to the endurance test and color shift test in the manner mentioned above. The results are shown in Table 1.

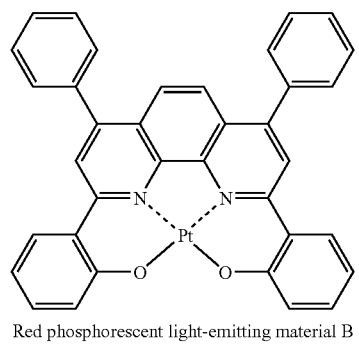

Red phosphorescent light-emitting material B

Comparative Example 3

An organic EL element of Comparative Example 3 was prepared in the same manner as in Example 1, provided that the blue phosphorescent light-emitting material A used in Example 1 was replaced with the blue phosphorescent light-emitting material C. The obtained organic EL element was subjected to the endurance test and color shift test in the manner mentioned above. The results are shown in Table 1.

Example 5

An organic EL element of Example 5 was prepared in the same manner as in Example 1, provided that instead of depositing the light-emitting layer containing 1.0% by mass of the red phosphorescent light-emitting material A on the hole-transport layer as in Example 1, a light-emitting layer containing 0.1% by mass of the red phosphorescent light-emitting material A was deposited on the hole-transport layer. The obtained organic EL element was subjected to the endurance test and color shift test in the manner mentioned above. The results are shown in Table 1.

Example 6

An organic EL element of Example 6 was prepared in the same manner as in Example 1, provided that instead of depositing the light-emitting layer containing 1.0% by mass of the red phosphorescent light-emitting material A on the hole-transport layer as in Example 1, a light-emitting layer containing 0.2% by mass of the red phosphorescent light-emitting material A was deposited on the hole-transport layer. The obtained organic EL element was subjected to the endurance test and color shift test in the manner mentioned above. The results are shown in Table 1.

Example 7

An organic EL element of Example 7 was prepared in the same manner as in Example 1, provided that instead of depositing the light-emitting layer containing 1.0% by mass of the red phosphorescent light-emitting material A on the hole-transport layer as in Example 1, a light-emitting layer containing 1.5% by mass of the red phosphorescent light-emitting material A was deposited on the hole-transport layer. The obtained organic EL element was subjected to the endurance test and color shift test in the manner mentioned above. The results are shown in Table 1.

Example 8

An organic EL element of Example 8 was prepared in the same manner as in Example 1, provided that instead of depositing the light-emitting layer containing 1.0% by mass of the red phosphorescent light-emitting material A on the hole-transport layer as in Example 1, a light-emitting layer containing 2.0% by mass of the red phosphorescent light-emitting material A was deposited on the hole-transport layer. The obtained organic EL element was subjected to the endurance test and color shift test in the manner mentioned above. The results are shown in Table 1.

Example 9

An organic EL element of Example 9 was prepared in the same manner as in Example 1, provided that instead of depositing the light-emitting layer containing 15% by mass of the blue phosphorescent light-emitting material A on the hole-transport layer as in Example 1, a light-emitting layer containing 10% by mass of the blue phosphorescent light-emitting material A was deposited on the hole-transport layer. The obtained organic EL element was subjected to the endurance test and color shift test in the manner mentioned above. The results are shown in Table 1.

Example 10

An organic EL element of Example 10 was prepared in the same manner as in Example 1, provided that the blue phosphorescent light-emitting material A used in Example 1 was replaced with the blue phosphorescent light-emitting material D expressed by the following structural formula. The obtained organic EL element was subjected to the endurance test and color shift test in the manner mentioned above. The results are shown in Table 1.

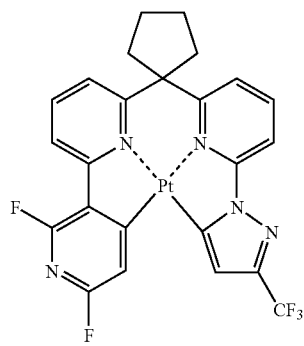

Blue phosphorescent light-emitting material D

Example 11

An organic EL element of Example 11 was prepared in the same manner as in Example 1, provided that the blue phosphorescent light-emitting material A used in Example 1 was replaced with the blue phosphorescent light-emitting material E expressed by the following structural formula. The obtained organic EL element was subjected to the endurance test and color shift test in the manner mentioned above. The results are shown in Table 1.

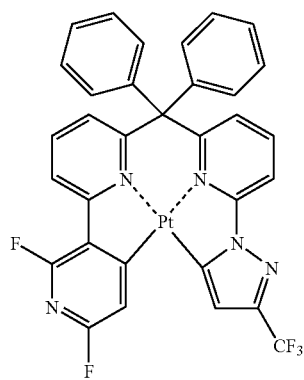

Blue phosphorescent light-emitting material E

Example 12

An organic EL element of Example 12 was prepared in the same manner as in Example 1, provided that the blue phosphorescent light-emitting material A used in Example 1 was replaced with the blue phosphorescent light-emitting material F expressed by the following structural formula. The obtained organic EL element was subjected to the endurance test and color shift test in the manner mentioned above. The results are shown in Table 1.

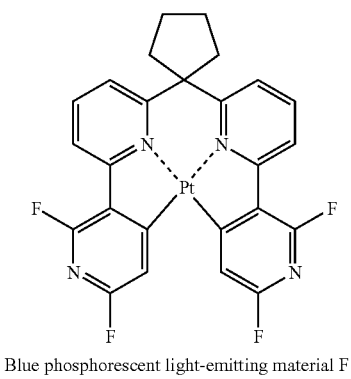

Blue phosphorescent light-emitting material F

Example 13

An organic EL element of Example 13 was prepared in the same manner as in Example 1, provided that the blue phosphorescent light-emitting material A used in Example 1 was replaced with the blue phosphorescent light-emitting material G expressed by the following structural formula. The obtained organic EL element was subjected to the endurance test and color shift test in the manner mentioned above. The results are shown in Table 1.

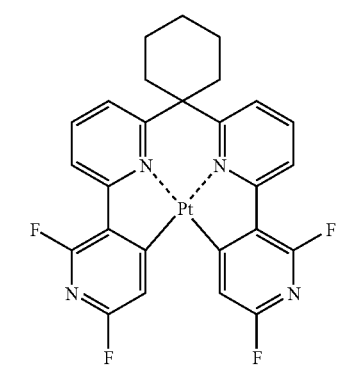

Blue phosphorescent light-emitting material G

Example 14

An organic EL element of Example 14 was prepared in the same manner as in Example 1, provided that the red phosphorescent light-emitting material A used in Example 1 was replaced with the red phosphorescent light-emitting material D expressed by the following structural formula. The obtained organic EL element was subjected to the endurance test and color shift test in the manner mentioned above. The results are shown in Table 1.

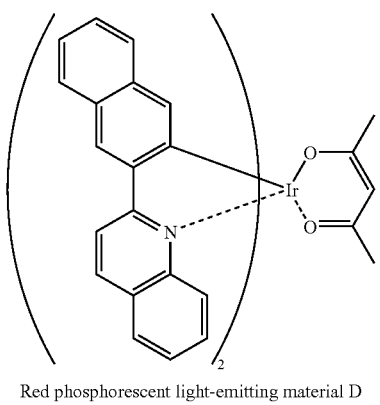

Red phosphorescent light-emitting material D

Example 15

An organic EL element of Example 15 was prepared in the same manner as in Example 1, provided that the red phosphorescent light-emitting material A used in Example 1 was replaced with the red phosphorescent light-emitting material E expressed by the following structural formula. The obtained organic EL element was subjected to the endurance test and color shift test in the manner mentioned above. The results are shown in Table 1.

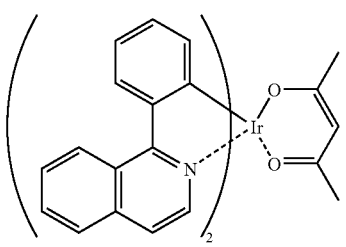

Red phosphorescent light-emitting material E

Example 16

An organic EL element of Example 16 was prepared in the same manner as in Example 1, provided that the red phosphorescent light-emitting material A used in Example 1 was replaced with the red phosphorescent light-emitting material F expressed by the following structural formula. The obtained organic EL element was subjected to the endurance test and color shift test in the manner mentioned above. The results are shown in Table 1.

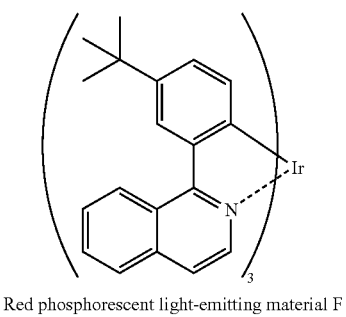

Red phosphorescent light-emitting material F

TABLE 1

| | Light-emitting material 1 | | Light-emitting material 2 | | | Endurance | | Color |
|---|---|---|---|---|---|---|---|---|
| | Material | General formula 1 | Material | General formula (2A)~(2C) | Host material | Time | Result | Shift |
| Ex. 1 | Blue A | Yes | Red A | Yes | Charge transporting material A | 1 | A | A |
| Ex. 2 | Blue B | Yes | Red A | Yes | Charge transporting material A | 0.83 | A | A |
| Ex. 3 | Blue A | Yes | Red A | Yes | Charge transporting material B | 0.95 | A | A |
| Ex. 4 | Blue B | Yes | Red A | Yes | Charge transporting material B | 0.92 | A | A |
| Comp. Ex. 1 | Blue C | No | Red C | No | Charge transporting material A | 0.01 | B | A |
| Comp. Ex. 2 | Blue B | Yes | Red B | No | Charge transporting material A | 1.03 | A | C |
| Comp Ex. 3 | Blue C | No | Red A | Yes | Charge transporting material A | 0.006 | B | A |
| Ex. 5 | Blue A | Yes | Red A | Yes | Charge transporting material A | 0.85 | A | B |
| Ex. 6 | Blue A | Yes | Red A | Yes | Charge transporting material A | 0.8 | A | A |
| Ex. 7 | Blue A | Yes | Red A | Yes | Charge transporting material A | 1.05 | A | A |
| Ex. 8 | Blue A | Yes | Red A | Yes | Charge transporting material A | 1.03 | A | A |
| Ex. 9 | Blue A | Yes | Red A | Yes | Charge transporting material A | 0.95 | A | A |
| Ex. 10 | Blue D | Yes | Red A | Yes | Charge transporting material A | 0.82 | A | A |
| Ex. 11 | Blue E | Yes | Red A | Yes | Charge transporting material A | 0.78 | A | A |
| Ex. 12 | Blue F | Yes | Red A | Yes | Charge transporting material A | 0.83 | A | A |
| Ex. 13 | Blue G | Yes | Red A | Yes | Charge transporting material A | 1.05 | A | A |
| Ex. 14 | Blue A | Yes | Red D | Yes | Charge transporting material A | 0.98 | A | A |
| Ex. 15 | Blue A | Yes | Red E | Yes | Charge transporting material A | 0.95 | A | A |
| Ex. 16 | Blue A | Yes | Red F | Yes | Charge transporting material A | 0.97 | A | A |

Note that, in Table 1, "Blue" denotes a blue phosphorescent light-emitting material, and "Red" denotes a red phosphorescent light-emitting material.

The elements of Examples all emitted white light. Although the light emitted from the element of Example 8 had the chromaticity of (0.35, 0.33) that exhibited white, the light emitted from the element of Example 9 had the chromaticity of (0.39, 0.34) that exhibited slightly reddish white. This was probably because the amount of the red phosphorescent light-emitting material contained in the light-emitting layer was relatively high in Example 9.

The organic electroluminescence element of the present invention has less color shift due to voltage, is excellent in endurance, and provides a white element having a high adaptability on production. Therefore, the organic electroluminescence element of the present invention is suitably used for display elements, displays, backlights, electronic photos, illumination light sources, recording light sources, exposure light sources, reading light sources, signposts, signboards, interior decorations, and optical communications.

What is claimed is:

1. An organic electroluminescence element, comprising:
   at least one pair of electrodes;
   at least one organic light-emitting layer disposed between the electrodes, the organic light-emitting layer comprising two phosphorescent light-emitting materials and a charge-transporting material,
   wherein the organic light-emitting element is a white organic light-emitting element, and the charge-transporting material is a hole-transporting material, and
   wherein one of the two phosphorescent light-emitting materials is a platinum complex expressed by the following general formula 1, and the other is an iridium complex expressed by any one of the following general formulae 2A to 2C:

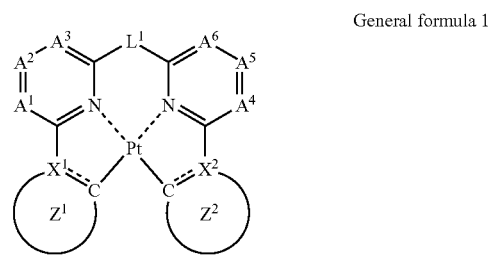

General formula 1 where $L^1$ is a single bond or a bivalent bridging group; $A^1$ to $A^6$ are each independently C—R or N in which R is a hydrogen atom or a substituent; $X^1$ and $X^2$ are each independently C or N; $Z^1$ and $Z^2$ are each independently a 5-member or 6-member aromatic ring formed together with X—C, or a 5-member or 6-member heterocyclic aromatic ring formed together with X—C, General formula 2A

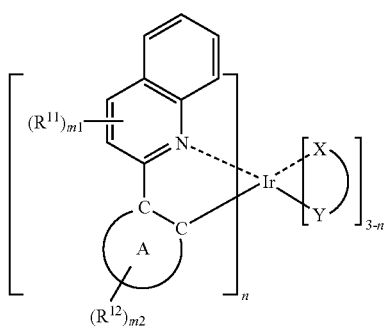

General formula 2B

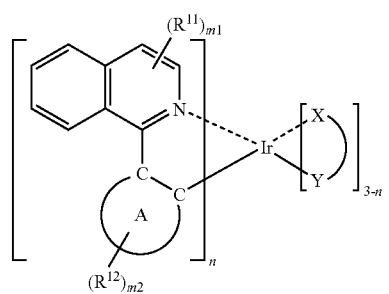

General formula 2C

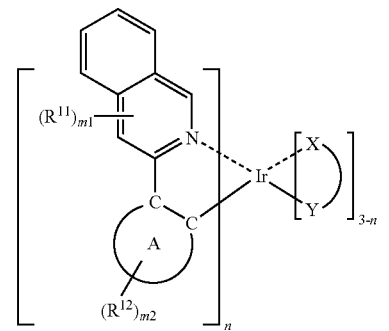

where n is an integer of 1 to 3; X—Y is a bidentate ligand; a ring A is a ring structure which may contain at least one selected from the group consisting of a nitrogen atom, a sulfur atom, and an oxygen atom; $R^{11}$ is a substitute, m1 is an integer of 0 to 6, and in the case where m1 is 2 or more, a plurality of $R^{11}$s adjacent to each other may bond to form a ring, which may contain at least one selected from the group consisting of a nitrogen atom, a sulfur atom, and an oxygen atom, and may further contain one or more substituents; $R^{12}$ is a substituent, m2 is an integer of 0 to 4, and in the case where m2 is 2 or more, a plurality of $R^{12}$s adjacent to each other may bond to form a ring, which may contain at least one selected from the group consisting of a nitrogen atom, a sulfur atom, and an oxygen atom, and may further contain one or more substituents; and $R^{11}$ and $R^{12}$ may bond to each other to form a ring, which may contain at least one selected from the group consisting of a nitrogen atom, a sulfur atom, and an oxygen atom, and may further contain one or more substituents.

2. The organic electroluminescence element according to claim 1, wherein the platinum complex is expressed by the following general formula 4:

General formula 4

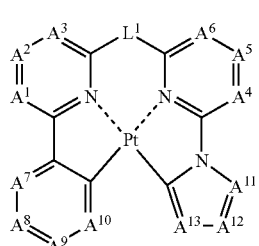

where $A^1$ to $A^{13}$ are each independently C—R or N in which R is a hydrogen atom or a substituent; and $L^1$ is a single bond or a divalent bridging group.

3. The organic electroluminescence element according to claim 2, wherein the platinum complex is expressed by any one of the following structural formulae 1 to 3:

Structural formula 1

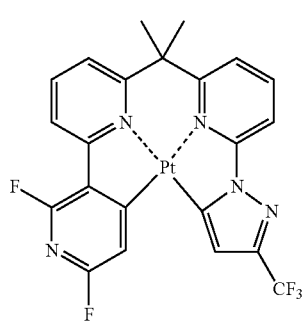

Structural formula 2

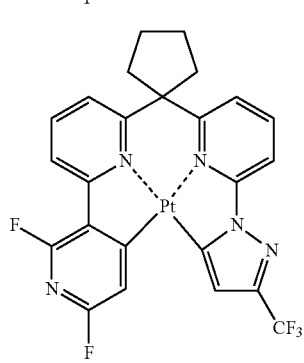

Structural formula 3

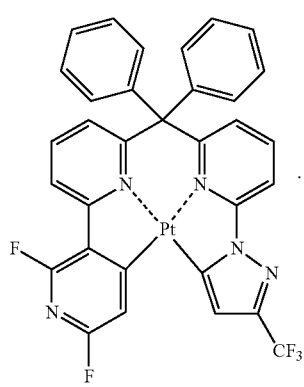

4. The organic electroluminescence element according to claim 1, wherein the platinum complex is expressed by the following general formula 5:

General formula 5

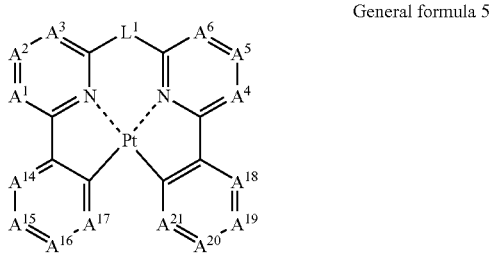

where $A^1$ to $A^6$ and $A^{14}$ to $A^{21}$ are each independently C—R or N in which R is a hydrogen atom or a substituent; and $L^1$ is a single bond or a divalent bridging group.

5. The organic electroluminescence element according to claim 4, wherein the platinum complex is expressed by any one of the following structural formulae 4 to 6:

Structural formula 4

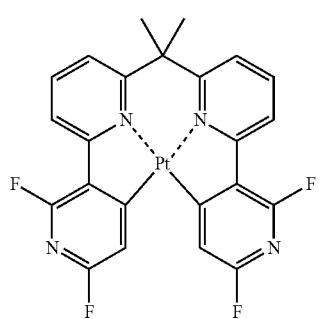

Structural formula 5

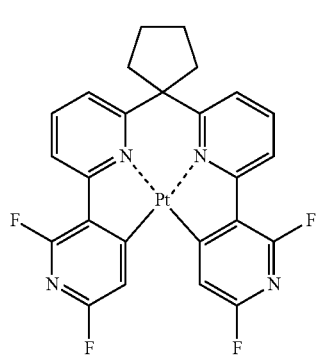

Structural formula 6

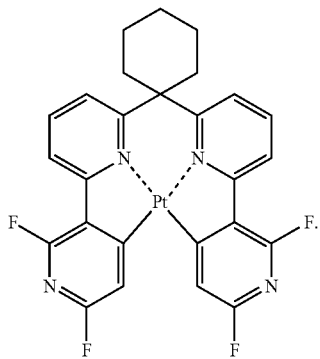

6. The organic electroluminescence element according to claim 1, wherein in the general formulae 2A to 2C, n is 1 or 2, and the bidentate ligand is a monoanionic bidentate ligand.

7. The organic electroluminescence element according to claim 6, wherein the monoanionic bidentate ligand is at least one selected from the group consisting of picolinate, acetylacetonate, and dipivaloylmethanate.

8. The organic electroluminescence element according to claim 6, wherein the iridium complex is expressed by any one of the following structural formulae 7 to 9:

Structural formula 7

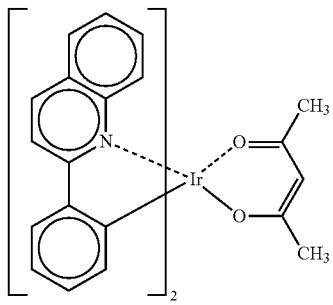

Structural formula 8

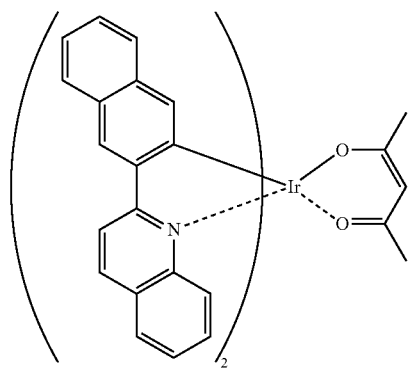

Structural formula 9

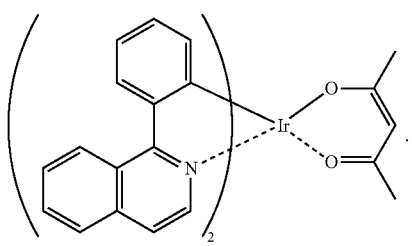

9. The organic electroluminescence element according to claim 1, wherein in the general formulae 2A to 2C, n is 3.

10. The organic electroluminescence element according to claim 9, wherein the iridium complex is expressed by the following structural formula 10:

Structural formula 10

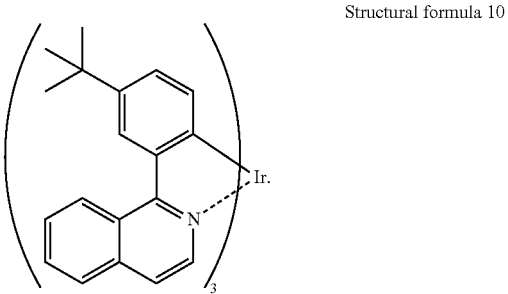

11. The organic electroluminescence element according to claim 1, wherein the iridium complex is contained in an amount of 0.2% by mass to 2.0% by mass relative to the total mass of all the compounds contained in the organic light-emitting layer.

12. The organic electroluminescence element according to claim 1, wherein the charge-transporting material is at least one selected from the group consisting of a pyrrole derivative, a carbazole derivative, a triazole derivatives, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a phthalocyanine compound, a porphyrin compound, a thiophene derivative, an organosilane derivative, and carbon.

13. The organic electroluminescence element according to claim 12, wherein the charge-transporting material is the carbazole derivative or the arylamine derivative.

14. The organic electroluminescence element according to claim 13, wherein the charge-transporting material is the carbazole derivative.

15. The organic electroluminescence element according to claim 14, wherein the charge-transporting material is expressed by any one of the following structural formulae 11 to 13:

Structural formula 11

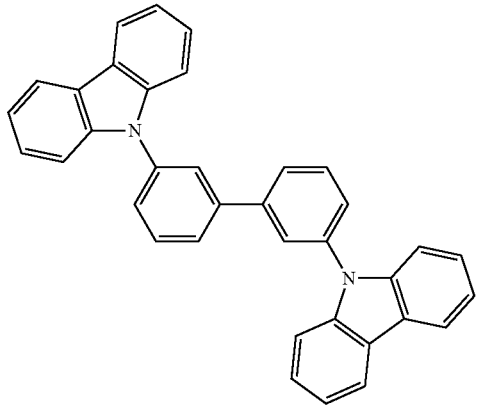

Structural formula 12

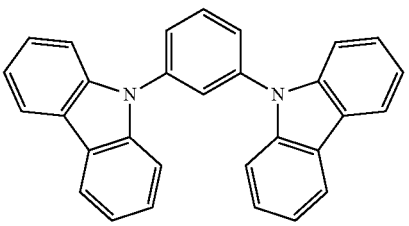

Structural formula 13

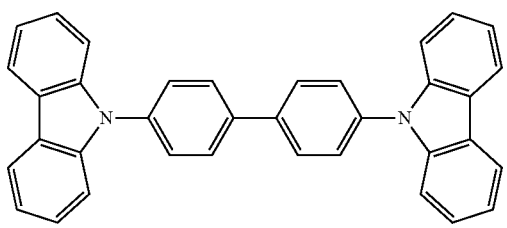

16. The organic electroluminescence element according to claim 1, further comprising a hole-transport layer and an electron-transport layer, wherein the hole-transport layer, the organic light-emitting layer, and the electron-transport layer are laminated in this order from the side of the anode.

17. The organic electroluminescence element according to claim 16, wherein the hole-transport layer has a thickness of 1 nm to 500 nm.

18. The organic electroluminescence element according to claim 16, wherein the electron-transport layer has a thickness of 1 nm to 500 nm.

* * * * *